United States Patent
Suzuki et al.

(10) Patent No.: US 8,764,902 B2
(45) Date of Patent: Jul. 1, 2014

(54) FILM-FORMING APPARATUS

(71) Applicant: ULVAC, Inc., Chigasaki (JP)

(72) Inventors: Yasumasa Suzuki, Chigasaki (JP); Kenji Kimura, Chigasaki (JP); Kazuya Tsukagoshi, Chigasaki (JP); Takashi Kageyama, Chigasaki (JP)

(73) Assignee: ULVAC, Inc., Chigasaki-shi (JP)

(*) Notice: Subject to any disclaimer, the term of this patent is extended or adjusted under 35 U.S.C. 154(b) by 0 days.

(21) Appl. No.: 13/738,278

(22) Filed: Jan. 10, 2013

(65) Prior Publication Data
US 2013/0174783 A1 Jul. 11, 2013

Related U.S. Application Data

(63) Continuation of application No. PCT/JP2011/065870, filed on Jul. 12, 2011.

(30) Foreign Application Priority Data

Jul. 12, 2010 (JP) ................................. 2010-158079

(51) Int. Cl.
| | | |
|---|---|---|
| C23C 16/455 | (2006.01) | |
| C23C 16/52 | (2006.01) | |
| H01L 21/3205 | (2006.01) | |
| H01L 21/36 | (2006.01) | |

(52) U.S. Cl.
CPC ................................. C23C 16/45572 (2013.01)
USPC ...................................... 118/715; 156/345.34

(58) Field of Classification Search
CPC ................. C23C 16/45563; C23C 16/45565; C23C 16/45572; C23C 16/45574; C23C 16/45576; H01L 21/3141; H01L 21/67248; H01L 21/0228; H01L 21/02271; H01L 21/02274
USPC ...................................... 118/715; 156/345.34
See application file for complete search history.

(56) References Cited

U.S. PATENT DOCUMENTS

2001/0047760 A1* 12/2001 Moslehi ................. 118/723.001

FOREIGN PATENT DOCUMENTS

| JP | 3442536 B2 | 9/2003 |
| JP | 2004-103630 A1 | 4/2004 |

(Continued)

OTHER PUBLICATIONS

International Search Report for International Application No. PCT/JP2011/065870 dated Aug. 16, 2011.

*Primary Examiner* — Parviz Hassanzadeh
*Assistant Examiner* — Satish Chandra
(74) *Attorney, Agent, or Firm* — Kratz, Quintos & Hanson, LLP

(57) ABSTRACT

A film-forming apparatus capable of discharging a feedstock gas and a reactive gas to an inner side of the vacuum chamber by more effectively cooling the gases without mixing them in comparison with the conventional art. A discharge plate having a first face exposed inside the vacuum chamber is provided with a plurality of feedstock gas introduction holes and a plurality of reactive gas introduction holes penetrating the discharge plate. A plurality of grooves having the feedstock gas introduction holes located on the bottom face are formed in the second face opposite to the first face of the discharge plate, a top plate that covers the groove is arranged over the second face, and the feedstock gas through-hole formed in the top plate and the feedstock gas introduction hole are connected to each other with the first auxiliary pipe.

7 Claims, 4 Drawing Sheets

(56) References Cited

FOREIGN PATENT DOCUMENTS

| JP | 2004-273565 | A1 | 9/2004 |
| JP | 2007-227789 | A1 | 9/2007 |
| JP | 2009-231611 | A1 | 10/2009 |
| JP | 2010-27675 | A1 | 2/2010 |
| JP | 2010-84190 | A1 | 4/2010 |
| JP | 2010-238831 | A1 | 10/2010 |

* cited by examiner

FILM-FORMING APPARATUS

This application is a continuation of International Application No. PCT/JP2011/065870, filed on Jul. 12, 2011, which claims priority to Japan Patent Application No. 2010-158079, filed on Jul. 12, 2010. The contents of the prior applications are herein incorporated by reference in their entireties.

BACKGROUND

The present invention generally relates to a film-forming apparatus, and more particularly, to a technical field of chemical vapor deposition (CVD).

Currently, gallium nitride (GaN) is used as a material of electronic elements such as a light-emitting diode (LED). In order to manufacture crystals of gallium nitride, a film-forming apparatus of a metalorganic chemical vapor deposition (MOCVD) method is used.

FIG. 7 shows an internal configuration diagram illustrating a conventional film-forming apparatus 110 of a MOCVD method.

The film-forming apparatus 110 includes a vacuum chamber 111, a plurality of feedstock gas pipes 127a for introducing a feedstock gas into the inner side of the vacuum chamber 111, a plurality of reactive gas pipes 127b for introducing a reactive gas into the inside of the vacuum chamber 111, and a heating device 143 for heating the object to be film-formed 140 located in the inner side of the vacuum chamber 111. Reference numeral 113 denotes a vacuum evacuator for vacuum evacuating the inside of the vacuum chamber 111.

A substrate holder 141 that holds the object to be film-formed 140 on its surface (holding surface) is provided inside the vacuum chamber 111. Reference numeral 147 denotes a rotator for rotating the substrate holder 141.

The heating device 143 includes an electrothermal resistor 142 and a power supply 144. The electrothermal resistor 142 is installed in the substrate holder 141; and the power supply 144 is electrically connected to the electrothermal resistor 142.

A cooling chamber 121 is arranged in a position facing the holding surface of the substrate holder 141. The cooling chamber 121 is connected to a cooling medium supply unit 155 for supplying a cooling medium to the inner side of the cooling chamber and a cooling medium discharge unit 156 for discharging the cooling medium to the outer side.

A reactive gas chamber 126 is arranged in a position opposite to the substrate holder 141 of the cooling chamber 121; and a feedstock gas chamber 134 is arranged in a position opposite to the cooling chamber 121 of the reactive gas chamber 126.

The feedstock gas introduction pipe 127a is arranged to penetrate the reactive gas chamber 126 and the cooling chamber 121. One end of the feedstock gas introduction pipe 127a is connected to the inner side of the feedstock gas chamber 134; and the opening 128a of the other end is exposed inside the vacuum chamber 111. The reactive gas introduction pipe 127b is arranged to penetrate the cooling chamber 121. One end of the reactive gas introduction pipe 127b is connected to the inner side of the reactive gas chamber 126; and the opening 128b of the other end is exposed inside the vacuum chamber 111.

The feedstock gas tank 151 arranged outside the vacuum chamber 111 is connected to the feedstock gas chamber 134; and the reactive gas tank 152 is connected to the reactive gas chamber 135. As the feedstock gas and the reactive gas are supplied to the inner sides of the feedstock gas chamber 134 and the reactive gas chamber 126 from the feedstock gas tank 151 and the reactive gas tank 152, respectively, the feedstock gas and the reactive gas are discharged to the inner side of the vacuum chamber 111 through the feedstock gas introduction pipe 127a and the reactive gas introduction pipe 127b, respectively. The feedstock gas and the reactive gas supplied from the feedstock gas tank 151 and the reactive gas tank 152, respectively, are not mixed until they are discharged to the inner side of the vacuum chamber 111.

When an electric current flows from the power supply 144 to the electrothermal resistor 142, and the object to be film-formed 140 on the substrate holder 141 is heated, a thin film is formed on the surface of the object to be film-formed 140 inside the vacuum chamber 111 by virtue of a chemical reaction between the discharged feedstock gas and the discharged reactive gas.

In order to mix the feedstock gas and the reactive gas immediately before the surface of the object to be film-formed 140, the opening 128a of the end portion of the feedstock gas introduction pipe 127a and the opening 128b of the end portion of the reactive gas introduction pipe 127b are located near the surface of the object to be film-formed 140. If the object to be film-formed 140 is heated to a high temperature, the feedstock gas introduction pipe 127a and the reactive gas introduction pipe 127b are heated by the heat of the object to be film-formed 140, so that the feedstock gas and the reactive gas may be decomposed inside each pipe 127a and 127b. In particular, when the feedstock gas is an organic metal gas, it is highly probable that the feedstock gas becomes thermally decomposed inside the feedstock gas introduction pipe 127a.

Accordingly, it is necessary to cool the feedstock gas introduction pipe 127a and the reactive gas introduction pipe 127b using the thermal transfer with the cooling medium by flowing the temperature-controlled cooling medium from the cooling medium supply unit 155 through the inner side of the cooling chamber 121 and discharging the cooling medium from the cooling medium discharge unit 156 during the film formation.

However, in the film-forming apparatus 110 of the conventional art, both the feedstock gas introduction pipe 127a and the reactive gas introduction pipe 127b are arranged to penetrate the same cooling chamber 121. Therefore, if the cooling medium flows through the inner side of the cooling chamber 121, the cooling medium may diffuse to the inner side of the cooling chamber 121 so as to generate whirling or partial clogging of the flow, thereby resulting in a temperature of the cooling medium inside the cooling chamber 121 or a cooling effect of each pipe 127a and 127b becoming non-uniform.

For example, when the center of the object to be film-formed 140 is easily heated in comparison to the outer edge, the pipes 127a and 127b arranged to face the center of the object to be film-formed 140 are heated to a temperature higher than the temperature of the other pipes, even when the cooling medium flows through the inner side of the cooling chamber 121; and consequently, the feedstock gas or the reactive gas inside the pipe 127a or 127b may be thermally decomposed. Furthermore, because a temperature distribution is not uniform between the center and the outer edge of the object to be film-formed 140, there is a problem in that the quality of the formed thin film may become non-uniform (Japanese Patent No. 3442536).

SUMMARY OF THE INVENTION

The present invention has been made to solve the aforementioned problems of the conventional art, and provides a film-forming apparatus capable of more effectively cooling the feedstock gas and the reactive gas, and discharging the gases without mixing them in comparison with the conventional art.

According to an aspect of the present invention, there is provided a film-forming apparatus that includes a vacuum chamber, a discharge plate having a first face and a second face opposite to the first face, a plurality of reactive gas introduction holes and a plurality of feedstock gas introduction holes, each of which penetrates the discharge plate, and a heating device for heating an object to be film-formed located inside the vacuum chamber. The first face is exposed inside the vacuum chamber, as a feedstock gas and a reactive gas are supplied to the feedstock gas introduction holes and the reactive gas introduction holes from a feedstock gas tank and a reactive gas tank arranged outside the vacuum chamber, and the feedstock gas is discharged from a feedstock gas opening located in the first face of the feedstock gas introduction hole to the inside of the vacuum chamber, when a reactive gas is discharged from a reactive gas opening located in the first face of the reactive gas introduction hole to the inside of the vacuum chamber, so that a thin film is formed on a surface of the object to be film-formed by using the discharged feedstock gas and the discharged reactive gas. The film-forming apparatus further comprising a plurality of grooves formed in the second face in a manner such that the feedstock gas introduction holes are located on a bottom face, a top plate arranged on the second face to cover the groove, a feedstock gas through-hole formed in the top plate, a cooling medium supply path connected to a groove space surrounded by the groove and the top plate and separated from an internal space of the vacuum chamber so as to supply a liquid cooling medium to the groove space, a cooling medium discharge path connected to the groove space so as to discharge the cooling medium flowing through the groove space and a first auxiliary pipe for connecting the feedstock gas introduction hole and the feedstock gas through-hole, and the feedstock gas flows through an inner side of the first auxiliary pipe and is discharged from the feedstock gas opening.

The present invention is the film-forming apparatus, which further includes a reactive gas chamber that is arranged on a surface of the top plate opposite to a surface of the top plate facing the groove, the reactive gas chamber being connected to each of the reactive gas introduction holes, a second auxiliary pipe having one end connected to the feedstock gas through-hole being arranged to penetrate the reactive gas chamber, and the feedstock gas passed through the second auxiliary pipe being discharged from the feedstock gas opening.

The present invention is the film-forming apparatus, wherein end portions of the first and second auxiliary pipes are connected to each other to provide a single connecting pipe.

The present invention is the film-forming apparatus, wherein a feedstock gas chamber is arranged in a position opposite to the top plate in the reactive gas chamber; and an end portion of the second auxiliary pipe is connected to an inner side of the feedstock gas chamber.

The present invention is the film-forming apparatus, which further includes a feedstock gas chamber arranged on a surface of the top plate opposite to a surface of the top plate facing the groove, the feedstock gas chamber being connected to each of the feedstock gas through-holes, a third auxiliary pipe having one end connected to the reactive gas introduction hole being arranged to penetrate the feedstock gas chamber, and the reactive gas passed through the third auxiliary pipe being discharged from the reactive gas opening.

The present invention is the film-forming apparatus, wherein a reactive gas chamber is arranged in a position opposite to the top plate of the feedstock gas chamber, and an end portion of the third auxiliary pipe is connected to an inner side of the reactive gas chamber.

Because the cooling medium individually flows through each path in a plurality of grooves, it is possible to prevent the flow of the cooling medium from being partially clogged and improve the cooling efficiency of the feedstock gas or the reactive gas.

The temperature or the flow amount of the cooling medium can be individually controlled for each path in the grooves. Therefore, if there are a first groove passing through a high temperature portion and a second groove passing through a low temperature portion, the temperature of the first groove can be lowered to the same temperature as that of the second groove.

DETAILED DESCRIPTION OF THE INVENTION

Figure 1:
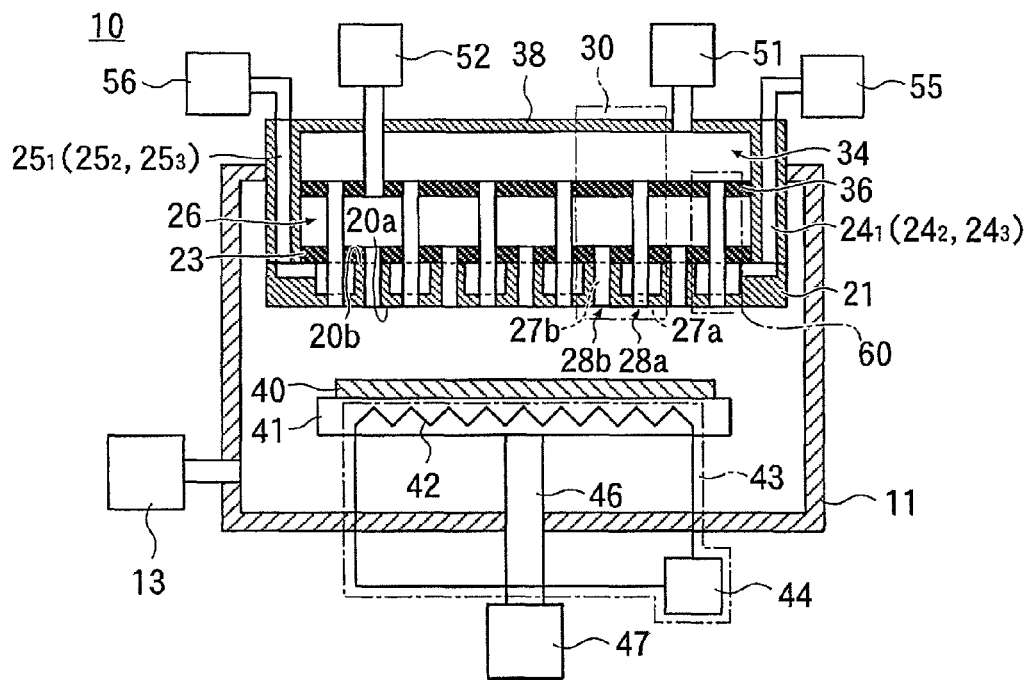
FIG. 1 is an internal configuration diagram illustrating a film-forming apparatus of the present invention.

A structure of the film-forming apparatus disclosed herein will be described. FIG. 1 is an internal configuration diagram illustrating the film-forming apparatus 10.

The film-forming apparatus 10 includes a vacuum chamber 11, a discharge plate 21 having a first face 20a and a second face 20b opposite to the first face 20a, a plurality of feedstock gas introduction holes 27a and a plurality of reactive gas introduction holes 27b, each of which penetrates the discharge plate 21, and a heating device 43 for heating the object to be film-formed 40 located inside the vacuum chamber 11. A feedstock gas discharge device 60 is shown in FIG. 1.

The wall face of the vacuum chamber 11 is provided with a rotational shaft 46 so as to hermetically penetrate the wall face.

In the end portion of the rotational shaft 46 located inside the vacuum chamber 11, a substrate holder 41 is fixed perpendicularly to the rotational shaft 46.

The substrate holder 41 holds the object to be film-formed 40 on a holding surface opposite to the surface where the rotational shaft 46 is fixed.

Here, the heating device 43 includes an electrothermal resistor 42 and a power supply 44. The electrothermal resistor 42 is installed inside the substrate holder 41; and the power supply 44 is electrically connected to the electrothermal resistor 42. As a direct current (DC) flows from the power supply 44 to the electrothermal resistor 42, the electrothermal resistor 42 generates heat so as to heat the object to be film-formed 40 held by the substrate holder 41.

The heating device 43 of the present invention includes a structural arrangement disclosed in other techniques known in the art (such as, an infrared lamp or laser) if the heating device 43 can heat the object to be film-formed 40 without limiting it to a structural arrangement having the electrothermal resistor 42 and the power supply 44.

The discharge plate 21 is arranged to face the holding surface of the substrate holder 41; and the first face 20a of the discharge plate 21 is oriented to face the holding surface of the substrate holder 41 and is exposed inside the vacuum chamber 11.

If the feedstock gas and the reactive gas which reacts with the feedstock gas when they are mixed are supplied to the feedstock gas introduction hole 27a and the reactive gas introduction hole 27b, respectively, of the discharge plate 21, the feedstock gas is discharged from the feedstock gas opening 28a of the feedstock gas introduction hole 27a located in the first face 20a, and the reactive gas is discharged from the reactive gas opening 28b of the reactive gas introduction hole 27b located in the first face 20a to the inner side of the vacuum chamber 11. The feedstock gas and the reactive gas supplied from the feedstock gas tank 51 and the reactive gas tank 52, respectively, are not mixed until they are discharged from the feedstock gas opening 28a and the reactive gas opening 28b, as described below.

If the object to be film-formed 40 held in the substrate holder 41 is heated by the heating device 43, a thin film is formed on a surface of the object to be film-formed 40 inside the vacuum chamber 11 due to the chemical reaction between the discharged feedstock gas and the discharged reactive gas.

Figure 2:
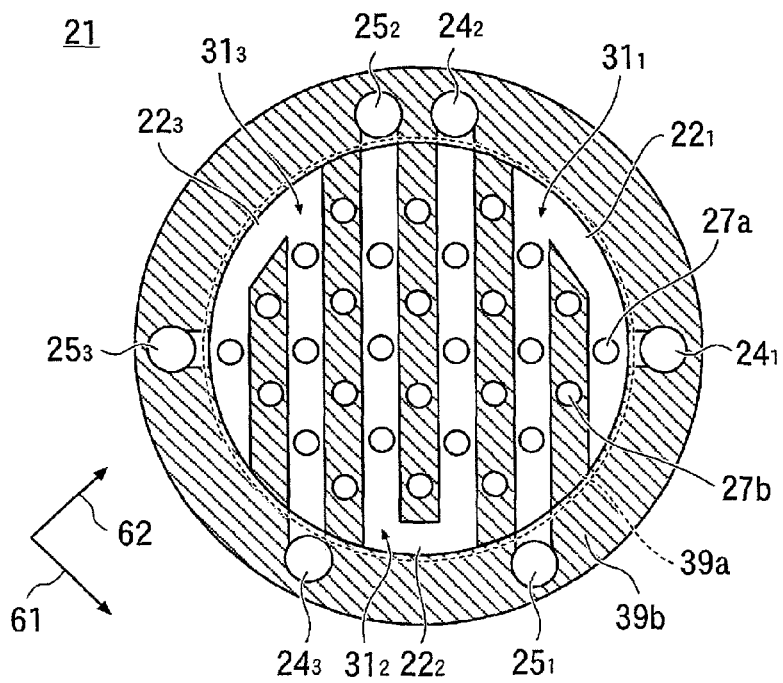
FIG. 2 is a plan view illustrating a discharge plate as seen from a second face.

FIG. 2 is a top plan view as seen from the second face 20b side of the discharge plate 21.

The second face 20b of the discharge plate 21 includes a discharge hole region 39a in the center portion and a ring-shaped seal region 39b in an outer circumference of the discharge hole region 39a.

A plurality of grooves $22_1$ to $22_3$ having the feedstock gas introduction holes 27a located on the bottom face are formed in the discharge hole region 39a in the second face 20b of the discharge plate 21. The respective routes or lengths of the grooves $22_1$ to $22_3$ are determined based on the temperatures the grooves $22_1$ to $22_3$ when the object to be film-formed 40 is heated.

The diameter of the feedstock gas introduction hole 27a is formed to be shorter than the width of the groove $22_1$, $22_2$, or $22_3$; and each feedstock gas introduction hole 27a is arranged side by side along an extending direction of the grooves $22_1$ to $22_3$.

Here, the feedstock gas introduction holes 27a and the reactive gas introduction holes 27b are alternately arranged side by side with an equal distance along the first direction 61 and the second direction 62 perpendicular to the first direction 61, respectively, in the inner side of the discharge hole region 39a. The adjacent feedstock gas introduction holes 27a and reactive gas introduction holes 27b are separated from each other.

Figure 3:
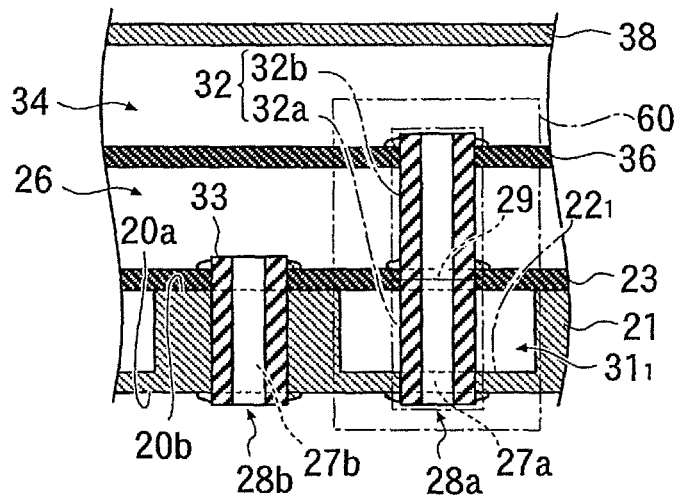
FIG. 3 is a partially enlarged view illustrating a film-forming apparatus of the present invention.

FIG. 3 is a partially enlarged view illustrating the area 30 of the film-forming apparatus 10 in FIG. 1. The structures of the grooves $22_1$ to $22_3$ are the same; and as a representative groove, a description is hereinafter made for the groove $22_1$.

The film-forming apparatus 10 includes a top plate 23 arranged over the second face 20b so as to cover the groove $22_1$, a feedstock gas through-hole 29 provided in the top plate 23, and a first auxiliary pipe 32a for connecting the feedstock gas introduction hole 27a and the feedstock gas through-hole 29.

The outer diameter of the first auxiliary pipe 32a is formed to be shorter than the width of the groove $22_1$; and the outer circumferential side face of the first auxiliary pipe 32a is separated from the side face of the groove $22_1$.

Here, the reactive gas chamber 26, which is a hollow casing, is arranged on the rear face of the top plate 23 opposite to the surface facing the groove $22_1$; and the reactive gas chamber 26 is connected to each reactive gas introduction hole 27b of the discharge plate 21. The top plate 23 constitutes a part of the wall of the reactive gas chamber 26 and is provided with an opening for connection to the reactive gas introduction hole 27b.

In reference to FIG. 1, the reactive gas tank 52 arranged outside the vacuum chamber 11 is connected to the reactive gas chamber 26. As the reactive gas is supplied from the reactive gas tank 52 to the inner side of the reactive gas chamber 26, the supplied reactive gas passes through each reactive gas introduction hole 27b and is discharged to the inner side of the vacuum chamber 11 from the reactive gas opening 28b.

In reference to FIG. 3, the reactive gas pipe 33 is inserted into the reactive gas introduction hole 27b of the discharge plate 21, and the end portion of the reactive gas pipe 33 is connected to the inner side of the reactive gas chamber 26 through the opening of the top plate 23. A gap between the outer circumferential side face of the end portion of the reactive gas pipe 33 and the inner circumference of the opening of the top plate 23 is hermetically sealed and fixed by a brazing treatment so as to prevent the reactive gas in the reactive gas chamber 26 from leaking through the gap between the outer circumferential side face of the reactive gas pipe 33 and the inner circumference of the opening of the top plate 23 to the outer side.

In the reactive gas chamber 26, a second auxiliary pipe 32b having one end connected to the feedstock gas through-hole 29 of the top plate 23 is arranged through the reactive gas chamber 26. The gap between the outer circumferential side face of the end portion of the second auxiliary pipe 32b and the inner circumference of the feedstock gas through-hole 29 of the top plate 23 is hermetically sealed and fixed by a brazing treatment so as to prevent the reactive gas in the reactive gas chamber 26 from leaking through the gap between the outer circumferential side face of the second auxiliary pipe 32b and the inner circumference of the feedstock gas through-hole 29 to the outer side.

The end portions of the first and second auxiliary pipes 32a and 32b are connected to each other in order to provide a single connecting pipe 32. However, the first and second auxiliary pipes 32a and 32b of the present invention are individually formed.

The feedstock gas chamber 34, which is a hollow casing, is arranged in a position opposite to the top plate 23 of the reactive gas chamber 26, and the end portion of the second auxiliary pipe 32b opposite to the top plate 23 side is connected to the inner side of the feedstock gas chamber 34. The reactive gas chamber 26 and the feedstock gas chamber 34 have a common partition wall 36; and the partition wall 36 is provided with an opening for connecting to the end portion of the second auxiliary pipe 32b.

In reference to FIG. 1, the feedstock gas tank 51 arranged outside the vacuum chamber 11 is connected to the feedstock gas chamber 34. As the feedstock gas is supplied from the feedstock gas tank 51 to the inner side of the feedstock gas chamber 34, the supplied feedstock gas passes through the inner side of the second auxiliary pipe 32b, flows through the inner side of the first auxiliary pipe 32a, and is discharged to the inner side of the vacuum chamber 11 from the feedstock gas opening 28a, as shown in FIG. 3.

The gap between the outer circumferential side face of the end portion of the connecting pipe 32 and the inner circumference of the opening of the partitioning wall 36 is hermetically sealed and fixed by a brazing treatment so as to prevent the reactive gas in the reactive gas chamber 26 from leaking through the gap to the inner side of the feedstock gas chamber 32 and prevent the feedstock gas in the feedstock gas chamber 34 from leaking through the gap to the inner side of the reactive gas chamber 26.

In other words, the feedstock gas and the reactive gas supplied from the feedstock gas tank 51 and the reactive gas tank 52 to the feedstock gas chamber 34 and the reactive gas chamber 26, respectively, are not mixed with each other until they are discharged from the feedstock gas opening 28a and the reactive gas opening 28b.

In reference to FIGS. 1 and 2, the film-forming apparatus 10 includes cooling medium supply paths $24_1$ to $24_3$ connected to the groove spaces $31_1$ to $31_3$ which are surrounded by the side faces and the bottom faces of the grooves $22_1$ to $22_3$ and the surface of the top plate 23 and separated from the internal space of the vacuum chamber 11 so as to supply a liquid cooling medium to the groove spaces $31_1$ to $31_3$ and the cooling medium discharge paths $25_1$ to $25_3$ connected to the groove spaces $31_1$ to $31_3$ to discharge the cooling medium flowing through the groove spaces $31_1$ to $31_3$.

In reference to FIG. 2, the cooling medium supply paths $24_1$ to $24_3$ and the cooling medium discharge paths $25_1$ to $25_3$ are arranged in the seal region 39b.

The feedstock gas introduction holes 27a are arranged side by side along the extending direction of the grooves $22_1$ to $22_3$ on the bottom face of each groove $22_1$ to $22_3$. The portion of each grooves $22_1$ to $22_3$ at the outside of one end of a line of the feedstock gas introduction holes 27a and the portion of each grooves $22_1$ to $22_3$ at the outside of the other end of the line of the feedstock gas introduction holes 27a extend to the seal region 390b and these portions are connected to the cooling medium supply paths $24_1$ to $24_3$ and the cooling medium discharge paths $25_1$ to $25_3$, respectively.

In reference to FIG. 1, a cap-like lid member 38 (cylindrical in shape with one end being closed) is arranged on the second face 20b of the discharge plate 21 to cover the reactive gas chamber 26 and the feedstock gas chamber 34. The periphery of the lid member 38 having a ring-shape abuts onto and is hermetically fixed to the seal region 39b of the discharge plate 21.

The cooling medium supply paths $24_1$ to $24_3$ and the cooling medium discharge paths $25_1$ to $25_3$ penetrate the inner side of the side wall of the lid member 38 and extend to the outer side of the vacuum chamber 11.

In other words, each cooling medium flow path including the cooling medium supply paths $24_1$ to $24_3$, the groove spaces $31_1$ to $31_3$, and the cooling medium discharge paths $25_1$ to $25_3$ communicates with the atmosphere outside the vacuum chamber 11 and is separated from the internal space of the vacuum chamber 11 without communication.

The cooling medium supply unit 55 for supplying the temperature-controlled cooling medium is connected to the end portions of the cooling medium supply paths $24_1$ to $24_3$. The cooling medium supply unit 55 individually controls the flow rate or the temperature of the cooling medium supplied to each of the cooling medium supply paths $24_1$ to $24_3$.

Accordingly, if there are a first groove passing through a high temperature portion and a second groove passing through a low temperature portion of the discharge plate 21, it is possible to increase a cooling effect of the first auxiliary pipe 32a located in the groove space of the first groove by setting the temperature of the cooling medium flowing through the groove space of the first groove to be lower than the temperature of the cooling medium flowing through the groove space of the second groove or setting the flow rate of the cooling medium flowing through the groove space of the first groove to be higher than the flow rate of the cooling medium flowing through the groove space of the second groove, so that the temperature of the first auxiliary pipe 32a located in the groove space of the first groove can be lowered to the same temperature as that of the first auxiliary pipe 32a located in the groove space of the second groove.

The cooling medium discharge unit 56 for discharging the cooling medium to the outer side is connected to the end portions of the cooling medium discharge paths $25_1$ to $25_3$. Here, the cooling medium discharge unit 56 is connected to the cooling medium supply unit 55 in order to circulate the cooling medium.

In reference to FIG. 3, as the cooling medium is supplied to each groove space $31_1$ from the cooling medium supply unit 55, the cooling medium supplied to the groove space $31_1$ flows between the outer circumferential side face of each first auxiliary pipe 32a and the side face of the groove $22_1$.

The cooling medium flowing through the groove space $31_1$ makes contact with the outer circumferential side face of the first auxiliary pipe 32a so that the feedstock gas flowing through the inside of the first auxiliary pipe 32a is cooled by heat transfer with the cooling medium via the wall of the first auxiliary pipe 32a. The reactive gas flowing through the reactive gas pipe 33 is cooled by heat transfer with the cooling medium via the wall between the side face of the groove $22_1$ and the side face of the reactive gas introduction hole 27b.

In relation thereto, the gap between the outer circumferential side face of the end portion of the reactive gas pipe 33 and the inner circumference of the reactive gas opening 28b is hermetically sealed and fixed by a brazing treatment; and the gap between the outer circumferential side face of the end portion of the connecting pipe 32 and the inner circumference of the feedstock gas opening 28a is also hermetically sealed and fixed by a brazing treatment. Therefore, the cooling medium is prevented from leaking to the inner side of the vacuum chamber 11 from the gap between the outer circumferential side face of the end portion of the connecting pipe 32 and the inner circumference of the feedstock gas opening 28a. In addition, the cooling medium flowing into the gap between the upper end of the wall between the side face of the groove $22_1$ and the side face of the reactive gas introduction hole 27b (that is, the second face 20b of the discharge plate 21) and the top plate 23 is also prevented from leaking to the inner side of the vacuum chamber 11 through the gap between the outer circumferential side face of the end portion of the reactive gas pipe 33 and the inner circumference of the reactive gas opening 28b.

Figure 4:
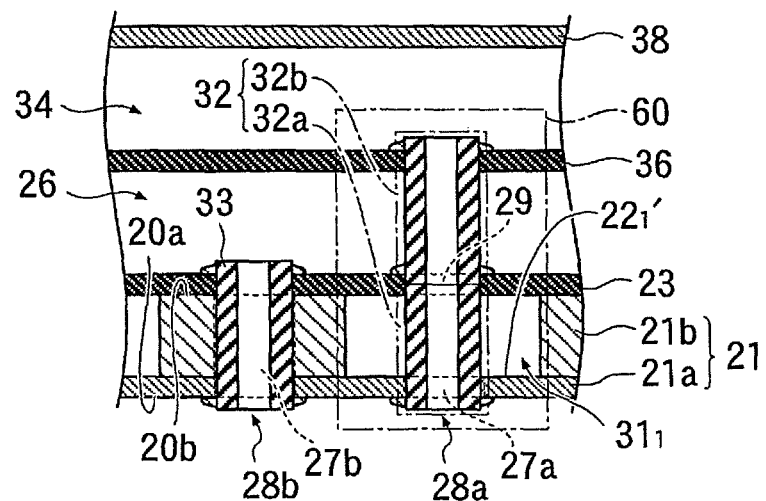
FIG. 4 is a partially enlarged view illustrating another configuration of the discharge plate.

The present invention is not however limited to a case where the discharge plate 21 is a single plate having a bottomed groove $22_1$ as shown in FIG. 3. Instead, as shown in FIG. 4, a structural arrangement is provided whereby the discharge plate 21 may include a lower plate 21a that is thinner than the above-discussed single plate and an intermediate plate 21b having an unbottomed groove $22_1$, as a through-hole that overlap.

The present invention is not limited to a case where the top plate 23 is included in a part of the wall of the reactive gas chamber 26. Instead, the present invention also includes a case having a wall separated from the top plate 23. In this case, the reactive gas chamber 26 can be arranged separately from the top plate 23. Therefore, it is possible to prevent the reactive gas chamber 26 from being heated by the heat of the object to be film-formed 40 by arranging the reactive gas chamber 26 far from the object to be film-formed 40 or providing a thermal insulating material between the reactive gas chamber 26 and the top plate 23.

The present invention is not limited to a case where the reactive gas chamber 26 and the feedstock gas chamber 34 share the partitioning wall 36. On the other hand, the present invention can have a structural arrangement where the reactive gas chamber 26 and the feedback gas chamber 34 may be separated by individual walls. In such a case, the feedstock gas chamber 34 can be arranged separately from the reactive gas chamber 26. Therefore, it is possible to prevent the feedstock gas chamber 34 from being heated by the heat of the object to be film-formed 40 by arranging the feedstock gas chamber 34 far from the object to be film-formed 40 or providing a thermal insulating material between the feedstock gas chamber 34 and the reactive gas chamber 26.

The film-forming apparatus 10 of the present invention is not limited to a case where the reactive gas chamber 26 is arranged on the rear surface of the top plate 23 opposite to the surface facing the grooves $22_1$ to $22_3$, and the feedstock gas chamber 34 is arranged in a position opposite to the top plate 23 of the reactive gas chamber 26, as shown in FIG. 1, if the first auxiliary pipe 32a for flowing the feedstock gas is arranged to penetrate the groove spaces $31_1$ to $31_3$. Instead, as shown in FIG. 5, the feedstock gas chamber 34 may be arranged on the rear surface of the top plate 23 opposite to the surface facing the grooves $22_1$ to $22_3$, and the reactive gas chamber 26 may be arranged in a position opposite to the top plate 23 of the feedstock gas chamber 34.

The film-forming apparatus 10' shown in FIG. 5 will hereinafter be described. For the configuration of the film-forming apparatus 10', the same reference numerals denote the same elements as in the structural arrangement of the film-forming apparatus 10 of FIG. 1.

Figure 5:
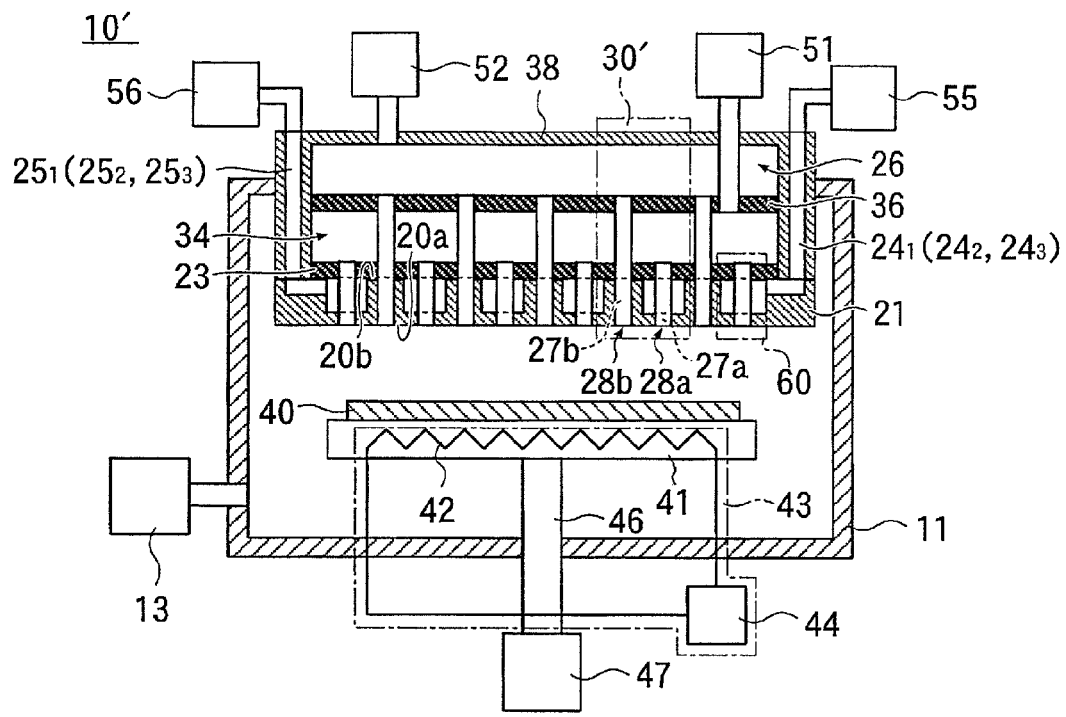
FIG. 5 is an internal configuration diagram illustrating a second example of the film-forming apparatus of the present invention.
Figure 6:
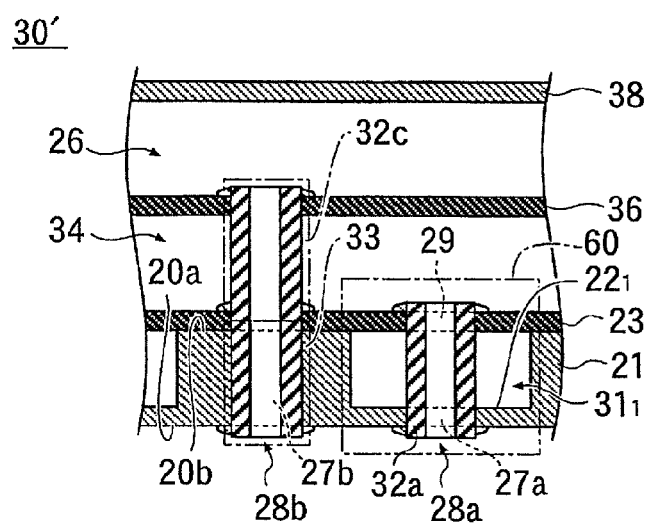
FIG. 6 is a partially enlarged view illustrating a second example of the film-forming apparatus of the present invention.
Figure 7:
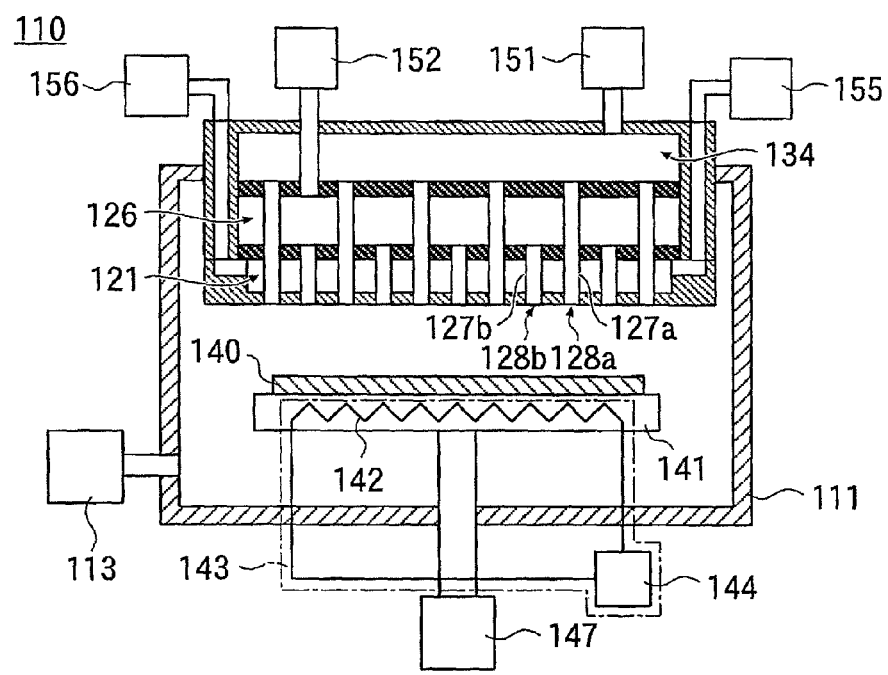
FIG. 7 is an internal configuration diagram illustrating a film-forming apparatus of the conventional art.

FIG. 6 is a partially enlarged view showing the area 30' of the film-forming apparatus 10' of FIG. 5. The structures of each groove $22_1$ to $22_3$ are the same; and thus, description of grooves $22_1$ to $22_3$ is similar to a description of a representative groove $22_1$.

The inner side of the feedstock gas chamber 34 is connected to each feedstock gas through-hole 29. As the feedstock gas is supplied from the feedstock gas tank 51 to the inner side of the feedstock gas chamber 34, the supplied feedstock gas passes through each first auxiliary pipe 32a and is discharged from the feedstock gas opening 28a to the inner side of the vacuum chamber 11.

Inside the feedstock gas chamber 34, a third auxiliary pipe 32c is arranged to penetrate the feedstock gas chamber 34. One end of the third auxiliary pipe 32c is connected to the reactive gas introduction hole 27b, and the other end is connected to the inner side of the reactive gas chamber 26. As the reactive gas is supplied from the reactive gas tank 52 to the reactive gas chamber 26, the supplied reactive gas passes through each third auxiliary pipe 32c and the reactive gas introduction hole 27b and is discharged from the reactive gas opening 28b to the inner side of the vacuum chamber 11.

In the film-forming apparatus 10', the feedstock gas chamber 34 is closer to the object to be film-formed 40 in comparison to the film-forming apparatus 10. However, the inner side of the feedstock gas chamber 34 is cooled by the cooling medium flowing through the groove spaces $31_1$ to $31_3$ via the top plate 23. Therefore, the feedstock gas in the feedstock gas chamber 34 is not thermally decomposed.

Although a description has been made for a case where the reactive gas pipe 33 is inserted into the reactive gas introduction hole 27b, and the end portion of the third auxiliary pipe 32c is connected to the end portion of the reactive gas pipe 33 so as to provide a single pipe, the present invention can also include a case where the third auxiliary pipe 32c and the reactive gas pipe 33 may be separate pipes.

Description will be made for an exemplary method for forming a film using the film-forming apparatuses 10 and 10' of the present invention when a thin film of gallium nitride (GaN) is formed on a surface of the object to be film-formed 40.

In reference to FIGS. 1 and 5, the vacuum evacuator 13 is connected to the wall face of the vacuum chamber 11 so as to vacuum evacuate the vacuum chamber 11. Then, the vacuum evacuation using the vacuum evacuator 13 is continued so that the vacuum ambience is maintained in the inner side of the vacuum chamber 11.

While the vacuum ambience is maintained in the vacuum chamber 11, the object to be film-formed 40 is transferred into the inner side of the vacuum chamber 11 and is held on the holding surface of the substrate holder 41.

A direct current (DC) flows to the electrothermal resistor 42 from the power supply 44 so that the object to be film-formed 40 is heated to a temperature of, for example, approximately 1100° C.

The rotator 47 is connected to the end portion of the rotational shaft 46 located outside the vacuum chamber 11. Here, the rotator 47 has a motor to rotate the rotational shaft 46 with respect to the central axial line.

The rotational shaft 46 is rotated by the rotator 47 so that the object to be film-formed 40 held by the substrate holder 41 is rotated in parallel to the first face 20a of the discharge plate 21. Then, the object to be film-formed 40 is continuously rotated.

The cooling medium is supplied to each cooling medium supply path $24_1$ to $24_3$ from the cooling medium supply unit 55 and is discharged from the cooling medium discharge unit 56 so as to circulate the temperature-controlled cooling medium through each groove space $31_1$ to $31_3$, as shown in FIG. 2. Then, the cooling medium is continuously circulated through each groove spaces $31_1$ to $31_3$.

In reference to FIGS. 1 and 5, the feedstock gas and the reactive gas are supplied to the inner sides of the feedstock gas chamber 34 and the reactive gas chamber 26 from the feedstock gas tank 51 and the reactive gas tank 52, respectively. Here, an organic metal gas of trimethyl gallium (TMGa) is used as the feedstock gas, and ammonia ($NH_3$) gas is used as the reactive gas.

In reference to FIGS. 3 and 6, the feedstock gas supplied to the inner side of the feedstock gas chamber 34 passes through the inner side of the first auxiliary pipe 32a and is discharged from the feedstock gas opening 28a. The reactive gas supplied to the inner side of the reactive gas chamber 26 passes through the inner side of the reactive gas pipe 33 and is discharged from the reactive gas opening 28b.

The first auxiliary pipe 32a and the reactive gas pipe 33 are cooled by the heat transfer with the cooling medium flowing through each groove space $31_1$ so as to prevent the feedstock gas and the reactive gas inside the first auxiliary pipe 32a and the reactive gas pipe 33 from being thermally decomposed by the heat of the object to be film-formed 40.

In reference to FIG. 2, because the cooling medium individually flows through each groove space $31_1$ to $31_3$, it is possible to prevent the flow of the cooling medium from being partially clogged and the cooling efficiency of the feedstock gas or reactive gas can be improved compared to the conventional art.

In reference to FIGS. 3 and 6, a constant flow amount of the cooling medium can make contact with each first auxiliary pipe 32a. Therefore, it is possible to reliably prevent thermal decomposition of the feedstock gas inside the first auxiliary pipe 32a.

It is difficult to cool the reactive gas pipe 33 in comparison to the first auxiliary pipe 32a. However, because an ammonia gas as the reactive gas is not thermally decomposed up to a temperature of 500° C., the reactive gas is not thermally decomposed inside the reactive gas pipe 33.

In reference to FIGS. 1 and 5, the feedstock gas and the reactive gas discharged from the feedstock gas opening 28a and the reactive gas opening 28b generate a chemical reaction by the heat of the object to be film-formed 40 so that a GaN thin film is formed on the surface of the object to be film-formed 40. Because the object to be film-formed 40 is rotated, the quality and the thickness of the formed thin film are uniform. A by-product produced together with GaN is vacuum evacuated using the vacuum evacuator 13.

For example, when the center of the object to be film-formed 40 is easily heated in comparison with the outer edge as shown in FIG. 2, it is possible to set the temperature of the cooling medium flowing through the groove $22_2$ passing through the center of the discharge plate 21 to be lower than the temperature of the cooling medium flowing through other grooves $22_1$ and $22_3$ or to set the flow rate of the cooling medium flowing through the groove $22_2$ passing through the center of the discharge plate 21 to be higher than the flow rate of the cooling medium passing through other grooves $22_1$ and $22_3$; and thus, the cooling effect of the first auxiliary pipe 32a located in the center of the discharge plate 21 can be improved and thermal decomposition of the feedstock gas inside the first auxiliary pipe 32a can be prevented. Furthermore, because the temperature at the center of the object to be film-formed 40 can be lowered by heat transfer to the cooling medium, it is possible to have the temperatures at the center and the outer edge of the object to be film-formed 40 to be uniform and thereby improve uniformity of the quality of the formed thin film.

After the thin film having a predetermined thickness is formed, supply of the feedstock gas and the reactive gas from the feedstock gas tank 51 and the reactive gas tank 52 stops. The heating of the object to be film-formed 40 is ceased by stopping the supply of power from the power supply 44 to the electrothermal resistor 42. In addition, rotation of the object to be film-formed 40 using the rotator 47 is terminated.

The object to be film-formed 40 after film formation is carried out to the outer side of the vacuum chamber 11 while the vacuum ambience is maintained inside the vacuum chamber 11. Then, another unprocessed object to be film-formed 40 is introduced into the inner side of the vacuum chamber 11, while the vacuum ambience is maintained; then, formation of the thin film according to the film formation method described above is repeated.

BRIEF DESCRIPTION OF THE REFERENCE NUMERALS

10 FILM-FORMING APPARATUS
11 VACUUM CHAMBER
20a FIRST FACE
20b SECOND FACE
21 DISCHARGE PLATE
$22_1$ to $22_3$ GROOVE
23 TOP PLATE
$24_1$ to $24_3$ COOLING MEDIUM SUPPLY PATH
$25_1$ to $25_3$ COOLING MEDIUM DISCHARGE PATH
26 REACTIVE GAS CHAMBER
27a FEEDSTOCK GAS INTRODUCTION HOLE
27b REACTIVE GAS INTRODUCTION HOLE
28a FEEDSTOCK GAS OPENING
28b REACTIVE GAS OPENING
29 FEEDSTOCK GAS THROUGH-HOLE
$31_1$ to $31_3$ GROOVE SPACE
32 CONNECTING PIPE
32a FIRST AUXILIARY PIPE
32b SECOND AUXILIARY PIPE
32c THIRD AUXILIARY PIPE
34 FEEDSTOCK GAS CHAMBER
40 OBJECT TO BE FILM-FORMED
51 FEEDSTOCK GAS TANK
52 REACTIVE GAS TANK

What is claimed is:

1. A film-forming apparatus, comprising: a vacuum chamber; a discharge plate having a first face and a second face opposite to the first face;
a plurality of reactive gas introduction holes and a plurality of feedstock gas introduction holes, each of which penetrates the discharge plate;
a heating device for heating an object to be film-formed located inside the vacuum chamber,
wherein the first face is exposed inside the vacuum chamber, when a feedstock gas and a reactive gas are supplied to the feedstock gas introduction holes and the reactive gas introduction holes from a feedstock gas tank and a reactive gas tank arranged outside the vacuum chamber, and the feedstock gas is discharged from a plurality of feedstock gas openings feedstock gas opening located in the first face of the feedstock gas introduction hole to the inside of the vacuum chamber, and a reactive gas is discharged from a reactive gas opening located in the first face of the reactive gas introduction hole to the inside of the vacuum chamber, so that a thin film is formed on a surface of the object to be film-formed by using the discharged feedstock gas and the discharged reactive gas;
the film-forming apparatus further comprising, a top plate arranged on the second face; a plurality of feedstock gas discharge devices; and the respective feedstock discharge device includes, a plurality of the feedstock gas openings;
a groove formed in the second face and covered by the top plate wherein the groove comprises a plurality of grooves which are isolated from one another and wherein only the feedstock gas auxiliary vertical pipes pass through them;
a plurality of feedstock gas introduction holes formed in a bottom face of the grooves and arranged along an extending direction of the groove, the feedstock gas introduction holes penetrate the discharge plate;
a plurality of feedstock gas through-holes formed in the top plate at a position above the groove;
a cooling medium supply path connected to a groove space surrounded by the groove and the top plate and separated from an internal space of the vacuum chamber so as to supply a liquid cooling medium to the groove space;
a cooling medium discharge path connected to the groove space so as to discharge the cooling medium flowing through the groove space; and
a first auxiliary pipe for connecting the feedstock gas introduction hole and the feedstock gas through-hole,
wherein the feedstock gas respectively flows through the plurality of first auxiliary pipes of the respective feedstock gas discharge device and is discharged from the plurality of the feedstock gas openings of the respective feedstock gas discharge device.

2. The film-forming apparatus according to claim 1, further comprising:
- a reactive gas chamber arranged on a surface of the top plate opposite to a surface of the top plate facing the groove, the reactive gas chamber being connected to each of the reactive gas introduction holes,
- a second auxiliary pipe having one end connected to the feedstock gas through-hole arranged to penetrate the reactive gas chamber, and the feedstock gas that passed through the second auxiliary pipe being discharged from the feedstock gas opening.

3. The film-foaming apparatus according to claim 2, wherein end portions of the first and second auxiliary pipes are connected to each other to provide a single connecting pipe.

4. The film-forming apparatus according to claim 3, wherein a feedstock gas chamber is arranged on a surface of the reactive gas chamber opposite to a surface of the reactive gas chamber facing the top plate, and
- wherein an end portion of the second auxiliary pipe is connected to an inner side of the feedstock gas chamber.

5. The film-forming apparatus according to claim 2, wherein a feedstock gas chamber is arranged on a surface of the reactive gas chamber opposite to a surface of the reactive gas chamber facing the top plate, and
- an end portion of the second auxiliary pipe is connected to an inner side of the feedstock gas chamber.

6. The film-forming apparatus according to claim 1, further comprising:
- a feedstock gas chamber arranged on a surface of the top plate opposite to a surface of the top plate facing the groove,
- wherein the feedstock gas chamber is connected to each of the feedstock gas through-holes;
- a third auxiliary pipe having one end connected to the reactive gas introduction hole arranged to penetrate the feedstock gas chamber,
- wherein the reactive gas passed through the third auxiliary pipe is discharged from the reactive gas opening.

7. The film-foaming apparatus according to claim 6, wherein a reactive gas chamber is arranged in a position opposite to the top plate of the feedstock gas chamber, and
- wherein an end portion of the third auxiliary pipe is connected to an inner side of the reactive gas chamber.

* * * * *